(12) United States Patent
Choi et al.

(10) Patent No.: US 7,791,374 B2
(45) Date of Patent: Sep. 7, 2010

(54) APPARATUS AND METHOD OF ADJUSTING DRIVING VOLTAGE FOR SELECTIVE PRE-CHARGE

(75) Inventors: Sang Moo Choi, Yongin-si (KR); Han Su Pae, Hwaseong-si (KR)

(73) Assignees: Samsung Electronics, Co., Ltd., Gyeonggi-do (KR); Samsung SDI Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/318,853

(22) Filed: Jan. 9, 2009

(65) Prior Publication Data
US 2009/0184731 A1 Jul. 23, 2009

(30) Foreign Application Priority Data
Jan. 11, 2008 (KR) ................. 10-2008-0003318

(51) Int. Cl.
*H03K 19/094* (2006.01)
*H03K 19/096* (2006.01)

(52) U.S. Cl. .......................................... 326/83; 326/68

(58) Field of Classification Search ................ 326/63, 326/80, 83, 68, 95, 98; 327/333
See application file for complete search history.

(56) References Cited

U.S. PATENT DOCUMENTS 7,138,831 B2 * 11/2006 Tobita .................... 326/81

7,612,754 B2 * 11/2009 Kuo et al. ................. 345/100
2005/0093769 A1    5/2005 Ushigusa et al.

FOREIGN PATENT DOCUMENTS

| JP | 2005-122142 | 5/2005 |
| KR | 10-2005-0037303 | 4/2005 |
| KR | 10-0514079 | 9/2005 |
| KR | 10-0692847 | 3/2007 |

OTHER PUBLICATIONS

Abstract of KR 10-2004-0093504 published Nov. 6, 2004 which corresponds to KR 10-0514079.
Abstract of KR 10-2003-0024403 published Mar. 26, 2003 which corresponds to KR 10-0692847.

* cited by examiner

*Primary Examiner*—Daniel D Chang
(74) *Attorney, Agent, or Firm*—Harness, Dickey & Pierce, P.L.C.

(57) ABSTRACT

An output of a driving circuit is controlled by selectively outputting a first voltage or a second voltage as an N-th output voltage level in response to a first control signal and an N-th input voltage level, where N is a natural number, and pre-charging the selected N-th output voltage level to a third voltage or a fourth voltage, in response to a second control signal, the pre-charging being preformed based on the selected N-th output voltage level and a newly input (N+1)th input voltage level.

18 Claims, 10 Drawing Sheets line capaitor

APPARATUS AND METHOD OF ADJUSTING DRIVING VOLTAGE FOR SELECTIVE PRE-CHARGE

FOREIGN PRIORITY STATEMENT

This application claims priority under 35 U.S.C. §119 to Korean Patent Application No. 10-2008-0003318 filed on Jan. 11, 2008, in the Korean Intellectual Property Office (KIPO) the entire contents of which are incorporated herein by reference.

BACKGROUND

1. Technical Field

Embodiments relate to a driving circuit for selectively performing a pre-charge operation of a display panel, and a method of controlling an output of the driving circuit.

2. Discussion of Related Art

Display panels include liquid crystal displays (LCDs), plasma display panels (PDPs), organic light emitting diodes (OLEDs), or field emission displays (FEDs). Reducing power consumption is one of the major technologies for all display panels and a variety of methods are used therefor. A pre-charge technology is one of the power consumption reducing methods, in which, while a current output, for example, an N-th output, where N is a natural number, is maintained, the current output is pre-charged to a specific voltage before the current output is changed to the next output, for example, an (N+1)th output.

However, when the current (the Nth) output level and the next (the (N+1)th) output level are the same, if the current (the Nth) output level is changed to a pre-charge level and then to the next (the (N+1)th) output level, unnecessary power consumption is generated.

FIGS. 1A and 1B are waveform diagrams for explaining a conventional pre-charge operation. In FIG. 1A, an N-th output level A is output in response to an N-th input level, the Nth output level A is changed to a pre-charge level B in a pre-charge section, and an (N+1)th output level A is output in response to an (N+1)th input level. Although the N-th input level and the (N+1)th input level are not changed, pre-charge is unnecessarily performed. In FIG. 1B, the N-th output level A is output in response to the N-th input level, the N-th output level A is changed to the pre-charge level B in a pre-charge section, and an (N+1)th output level C is output in response to the (N+1)th input level.

FIG. 2 is a block diagram of a conventional driving circuit for explaining an example of a pre-charge operation method. In general, a display panel transmits and outputs an input signal for a frame. A driving unit 22 selectively outputs a first voltage V1 or a second voltage V2 as an output voltage OUT (an N-th frame output) in response to an input voltage level (an N-th frame input) input through an input unit 21.

The first control signal CTRL1 is a signal to control an output enable section in which a pre-charge operation is not performed. When a next input voltage level (an (N+1) th frame input) is input by the input unit 21, the driving unit 22 does not instantly change the output voltage OUT to a next output voltage level (an (N+1)th frame input). A pre-charge unit 23 is operated in response to the second control signal CTRL2. The pre-charge unit 23 changes the output voltage OUT to a third voltage V3 or a fourth voltage V4 that is a pre-charge level, in response to the second control signal CTRL2.

The driving unit 22 outputs the pre-charge voltage V3 or v4 according to the second control signal CTRL2 and does not output the first voltage V1 or the second voltage V2 in a specific section. When the pre-charge operation section designed corresponding to the specification of a product ends, the output voltage OUT pre-charged to the third voltage V3 or the fourth voltage V4 is changed to the first voltage V1 or the second voltage V2 of the driving unit 22 selected by the next input voltage level (the (N+1)th frame input) and is output as the (N+1)th frame output. The first voltage V1 or the second voltage V2 is output in response to the first control signal CTRL1 indicating the output enable section.

In the conventional pre-charge operation discussed above, unnecessary power consumption is generated when the current (the Nth) output level and the next (the (N+1)th) output level are the same, if the current (the Nth) output level is changed to a pre-charge level and then to the next (the (N+1)th) output level.

SUMMARY

Embodiments provide a driving circuit for selectively performing a pre-charge operation by a combination of an output voltage level that is currently (the N-th) output and an input voltage level that is input next (the (N+1)th), and a method of controlling an output of the driving circuit.

Embodiments provide a method of controlling an output of a driving circuit that comprises selectively outputting a first voltage or a second voltage as an N-th output voltage level in response to a first control signal and an N-th input voltage level, where N is a natural number; and selectively pre-charging the selected N-th output voltage level to a third voltage or a fourth voltage, in response to a second control signal, wherein the pre-charging is performed based on the selected N-th output voltage level and a newly input (N+1)th input voltage level.

According to embodiments, the pre-charging step does not perform the pre-charging when the logic values of the selected N-th output voltage level and the newly input (N+1)th input voltage level are the same or, According to embodiments, the pre-charging step does not perform the pre-charging when the logic values of the selected N-th output voltage level and the newly input (N+1)th input voltage level are not the same.

When the pre-charging operation is not performed, the (N+1)th input voltage is maintained unchanged.

Embodiments provide a driving circuit comprises a driving unit configured to select a first voltage or a second voltage as an N-th output voltage level in response to a first control signal and an N-th input voltage level input from an input unit where N is a natural number, and a pre-charge unit configured to pre-charge the selected N-th output voltage level to a third voltage or a fourth voltage in response to a second control signal, the selected N-th output voltage level, and a (N+1)th input voltage level that is newly input from the input unit.

According to embodiments, the pre-charge unit is configured to not operate when the logic values of the selected N-th output voltage level and the newly input (N+1)th input voltage level are the same.

According to embodiments, the pre-charge unit is configured to not operate when the logic values of the selected N-th output voltage level and the newly input (N+1)th input voltage level are not the same.

The pre-charge unit is configured so that when the pre-charge unit is not operated, the (N+1)th input voltage level is maintained unchanged.

Embodiments provide an apparatus comprising a pre-charge unit configured to selectively pre-charge an output node of a driving circuit. The pre-charge unit is configured to pre-charge the output node if an Nth input voltage input into the driving circuit and an (N+1) input voltage input into the driving circuit are different, and the pre-charge unit is configured to not pre-charge the output node if the Nth input voltage input into the driving circuit and the (N+1) input voltage input into the driving circuit are the same. N is a natural number.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1A:
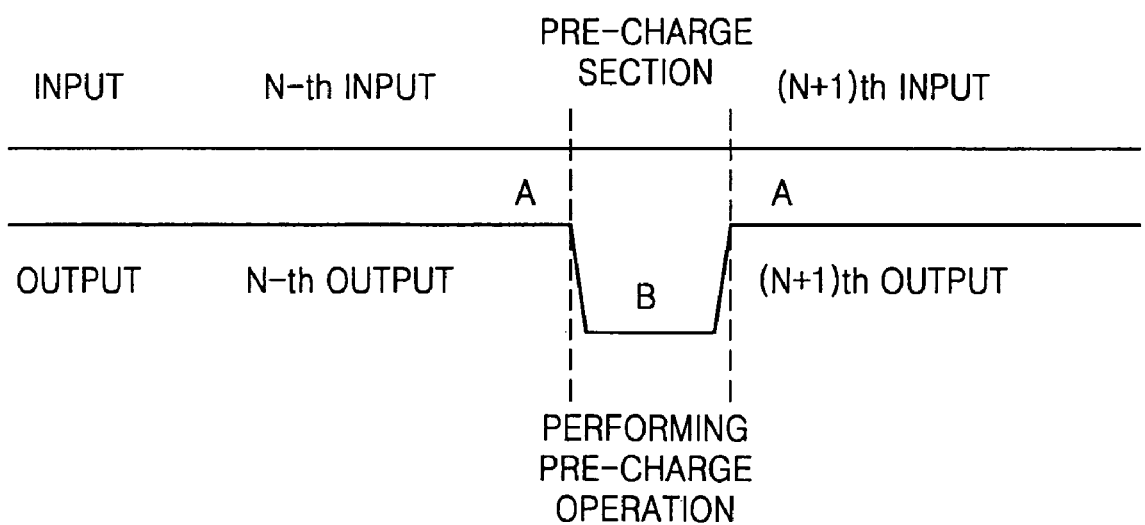
FIGS. 1A and 1B are waveform diagrams showing examples of a conventional pre-charge operation.
Figure 1B:
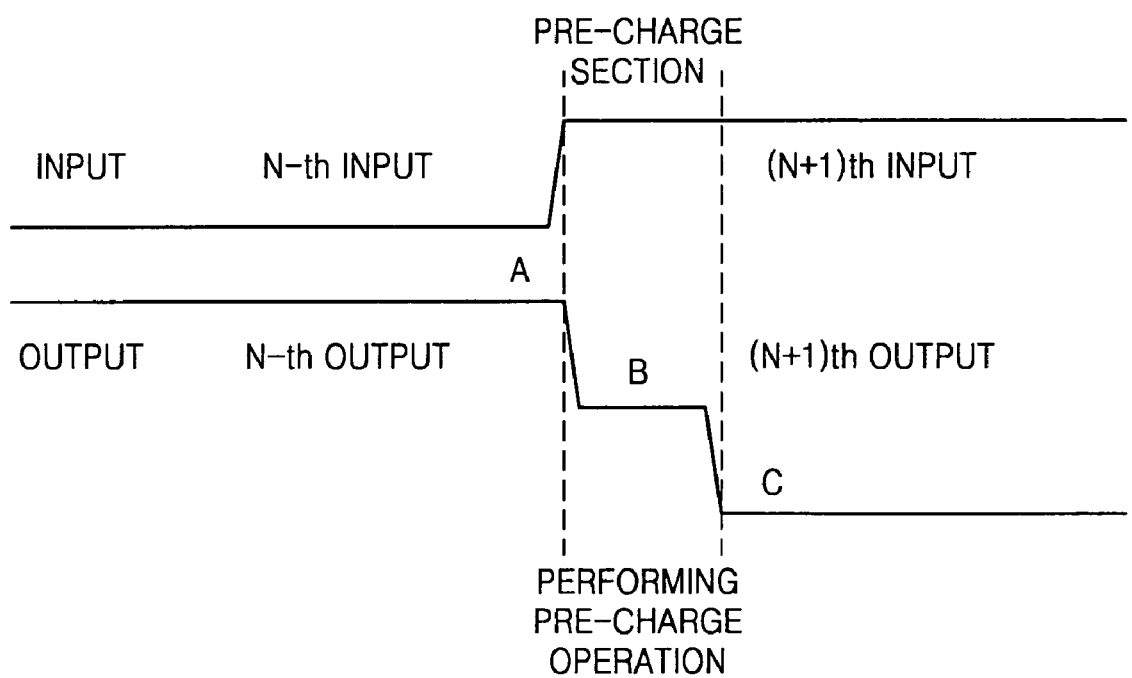

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
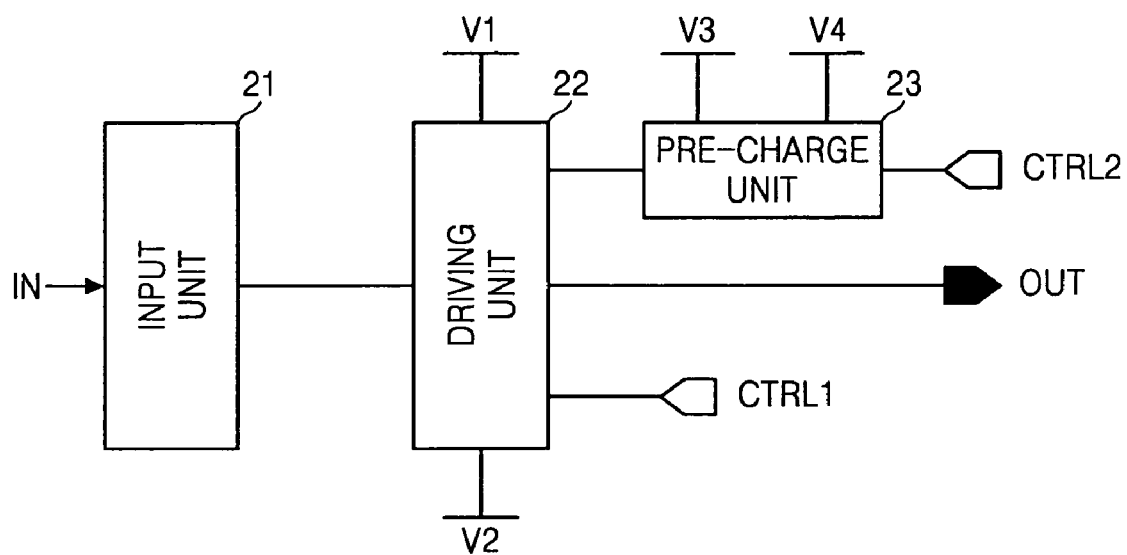
FIG. 2 is a block diagram of a conventional driving circuit showing an example of a pre-charge operation.
Figure 3:
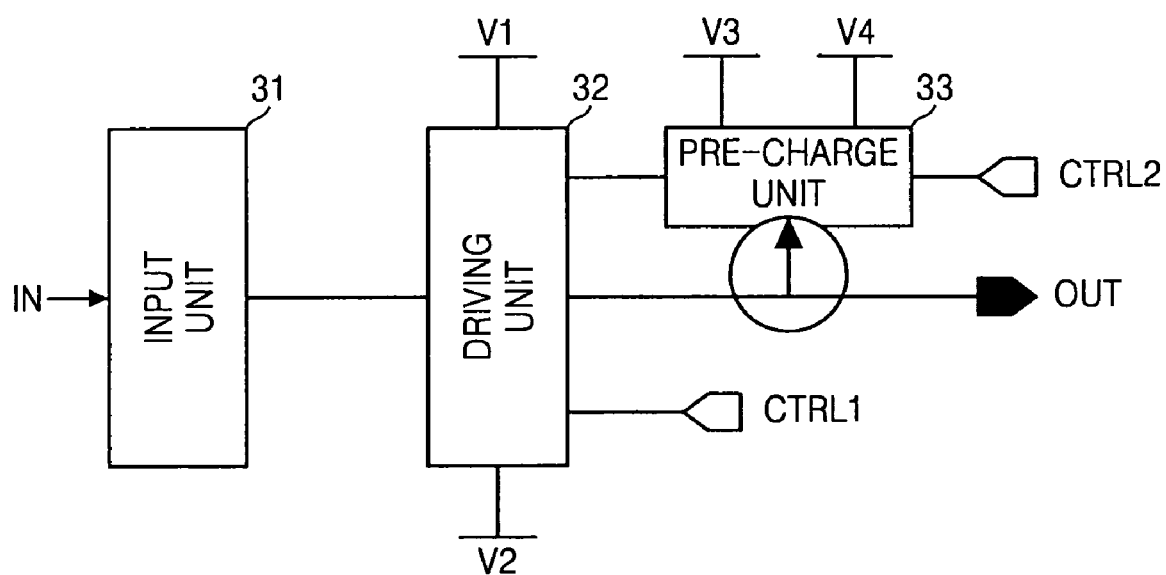
FIG. 3 is a block diagram of a driving circuit according to an embodiment of the inventive concept.

FIG. 3 is a block diagram of a driving circuit according to an embodiment of the inventive concept. In FIG. 3, since an input unit 31, a driving unit 32, the first voltage V1 and the second voltage V2, a pre-charge unit 33, the third voltage V3 and the fourth voltage V4, the first control signal CTRL1, and the second control signal CTRL2 are already described in FIG. 2, descriptions thereof will be omitted herein and a selective pre-charge operation that is a characteristic feature of the inventive concept will be mainly described.

The pre-charge unit 33 determines the pre-charge operation that is performed before the N-th frame output is changed to the (N+1)th frame output. The pre-charge unit 33 may select one of the pre-charge voltages V3 or V4, or not, according to a combination of the N-th output voltage level and the (N+1)th input voltage level. For example, when the N-th output voltage level is the first voltage V1, assuming that the N-th input voltage level is high, and the (N+1)th input voltage level input next is high, the pre-charge unit 33 neither selects a pre-charge voltage nor performs a pre-charge operation. Likewise, when the N-th output voltage level is the first voltage V1, assuming the N-th input voltage level is low, and the (N+1)th input voltage level input next is low, the pre-charge unit 33 neither selects a pre-charge voltage nor performs a pre-charge operation.

Accordingly, in the pre-charge section (or, during the pre-charge operation), the output voltage level OUT is maintained at the first voltage V1 that is the N-th output voltage level. When the pre-charge section ends in response to the second control signal CTRL2, the (N+1)th output voltage level maintains the first voltage V1 in the output enable section in response to the first control signal CTRL1. Thus, even when frames are changed, the driving circuit may reduce unnecessary power consumption by not performing the pre-charge operation if the input voltage level IN is not changed.

Figure 4:
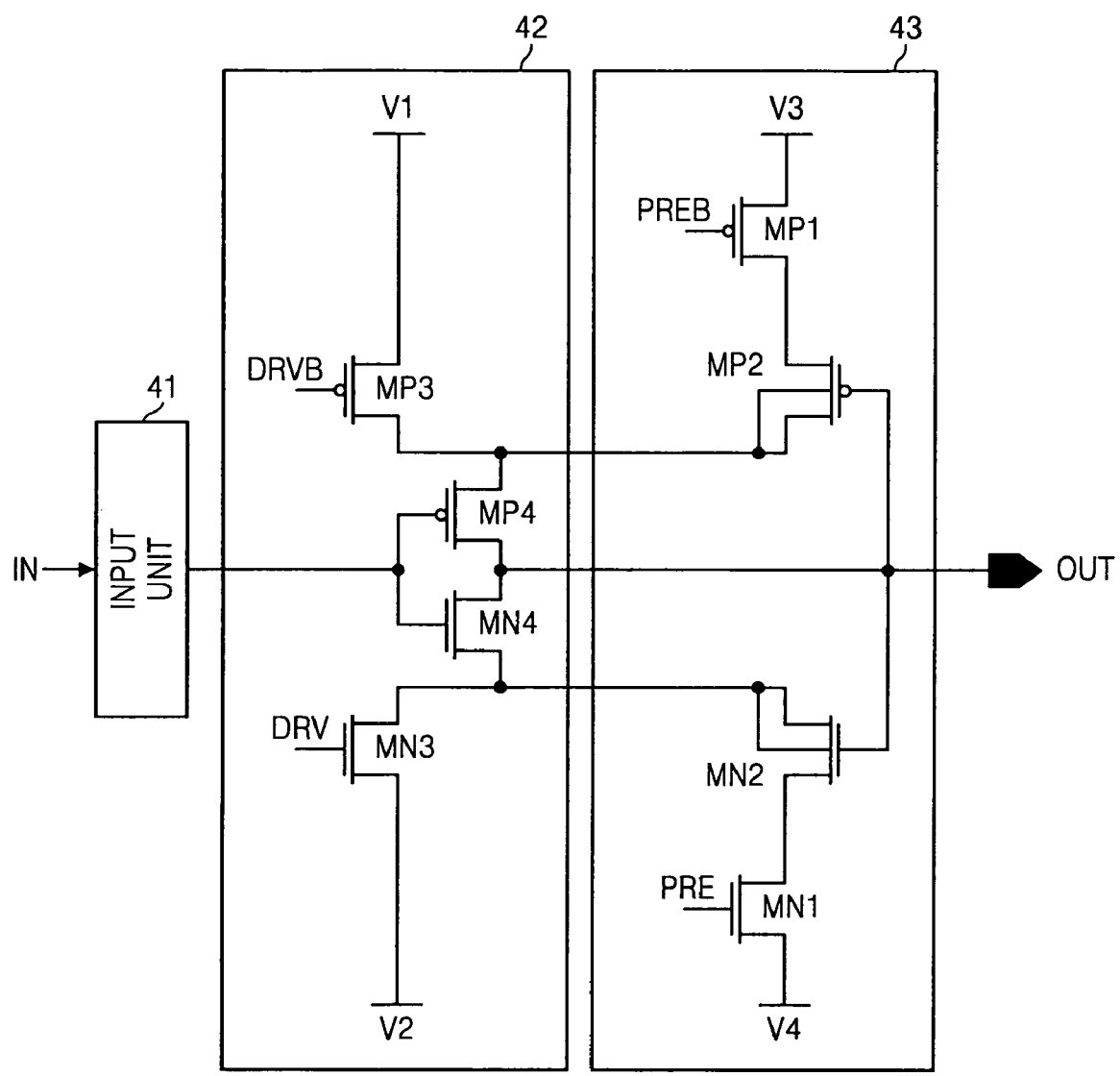
FIG. 4 is a circuit diagram of a driving circuit according to an embodiment of the inventive concept.

FIG. 4 is a circuit diagram of a driving circuit according to an embodiment of the inventive concept. Referring to FIG. 4, an input unit 41 transmits an input voltage IN to a driving unit 42. Although it is not illustrated, the input unit 41 may include a level shifter that changes an input swing level having a voltage different from the first voltage V1 or the second voltage V2 to the same swing level as the first voltage V1 or the second voltage V2 as in the driving unit 42. The driving unit 42 may be embodied by a tri-state inverter having three states according to driving signals DRV and DRVB and an input voltage level.

In the first state, when the first driving signal DRV is high, the second driving signal DRVB is low, and the input voltage level IN is high, the output voltage OUT has the second, or low, voltage level V2. In the second state, when the first driving signal DRV is high, the second driving signal DRVB is low, and the input voltage level IN is low, the output voltage OUT has the first, or high, voltage level V1. In the third state, when the first driving signal DRV is low and the second driving signal DRVB is high, the output voltage OUT is in an unknown state so as to have a floating level, regardless of the input voltage level IN.

When a load connected to an output end outputting the output voltage OUT has a storing characteristic like a capacitor, in the third state, a previous output voltage level or an output value may be maintained as the output voltage OUT. At least one of the first driving signal DRV and the second driving signal DRVB may be the first control signal CTRL1 of FIG. 3.

The pre-charge unit 43 may, or may not, output the third voltage V3 or the fourth voltage V4 that is a pre-charge voltage by a combination of the current, for example, the N-th, output voltage level and the next, for example, the (N+1)th, input voltage level when a first pre-charge signal PRE is high and a second pre-charge signal PREB is low. At least one of the first pre-charge signal PRE and the second pre-charge signal PREB may be the second control signal CTRL2 of FIG. 3.

Table 1 shows the pre-charge operation of the pre-charge unit 43 according to the combination of the current (the N-th) output voltage level and the next (the (N+1)th) input voltage level.

TABLE 1

| Combination | N-th output | (N + 1)th input | Pre-charge | Output voltage in pre-charge section |
|---|---|---|---|---|
| 1 | H (1$^{st}$ voltage) | L | Not operating | 1$^{st}$ voltage (H) |
| 2 | L (2$^{nd}$ voltage) | H | Not operating | 2$^{nd}$ voltage (L) |
| 3 | H (1$^{st}$ voltage) | H | Operating | 4$^{th}$ voltage |
| 4 | L (2$^{nd}$ voltage) | L | Operating | 3$^{rd}$ voltage |

In combination 1, when the N-th output is high, the (N+1)th input is low. Since the N-th input is also low, an input value is not changed. When the pre-charge section begins, the signals DRV, DRVB, PRE, and PREB are respectively low, high, high, and low. Since the N-th output is high, a turn-off voltage is applied to a gate of a second PMOS MP2 and a turn-on voltage is applied to a gate of the second NMOS MN2.

However, since the (N+1)th input is low, the turn-off voltage is supplied to a gate of a fourth NMOS MN4 so that the output voltage OUT is not connected (or pre-charged) to the fourth voltage V4 that is the pre-charge voltage. Although the turn-on voltage is applied to a gate of a fourth PMOS MP4, since the turn-off voltage is applied to the gate of the second PMOS MP2, the output voltage OUT is not connected (pre-charged) to the third voltage V3 that is the pre-charge voltage.

Thus, during the pre-charge section, the N-th output voltage level is maintained as the output voltage level. If there is no capacitor component at the output end and the pre-charge section is quite long, it may be difficult to maintain the N-th output voltage level. However, since a capacitor is generally present at the output end of a display panel, the pre-charge section is very shorter than a display section.

In combination 3, when the N-th output is high, the (N+1)th input is high. Since the N-th input is low, the input value is changed. The control signals in the pre-charge section are the same as those in combination 1.

Since the N-th output is high, the turn-off voltage is applied to the gate of the second PMOS MP2 and the turn-on voltage is applied to the gate of the second NMOS MN2. Since the (N+1)th input is high, the turn-off voltage is supplied to the gate of the fourth PMOS MP4 and the turn-on voltage is supplied to the gate of the fourth NMOS MN4 so that the output voltage OUT is connected (or pre-charged) to the fourth voltage V4 that is the pre-charge voltage. When the pre-charge section ends, the signals PRE, PREB, DRV, and DRVB are respectively low, high, high, and low.

Accordingly, the fourth NMOS MN4 is turned on in response to the (N+1)th input that is high so that the second voltage V2 that is low becomes the (N+1)th output voltage OUT. That is, when entering the pre-charge section at the first voltage V1 that is high, the N-th output is changed to the fourth voltage V4 that is the pre-charge voltage. Also, when entering the display section, the N-th output is changed to the second voltage V2 that is low.

Combination 2 is the opposite case to combination 1. In Combination 4, the pre-charge operation is performed according to the input modified from combination 2.

Figure 5A:
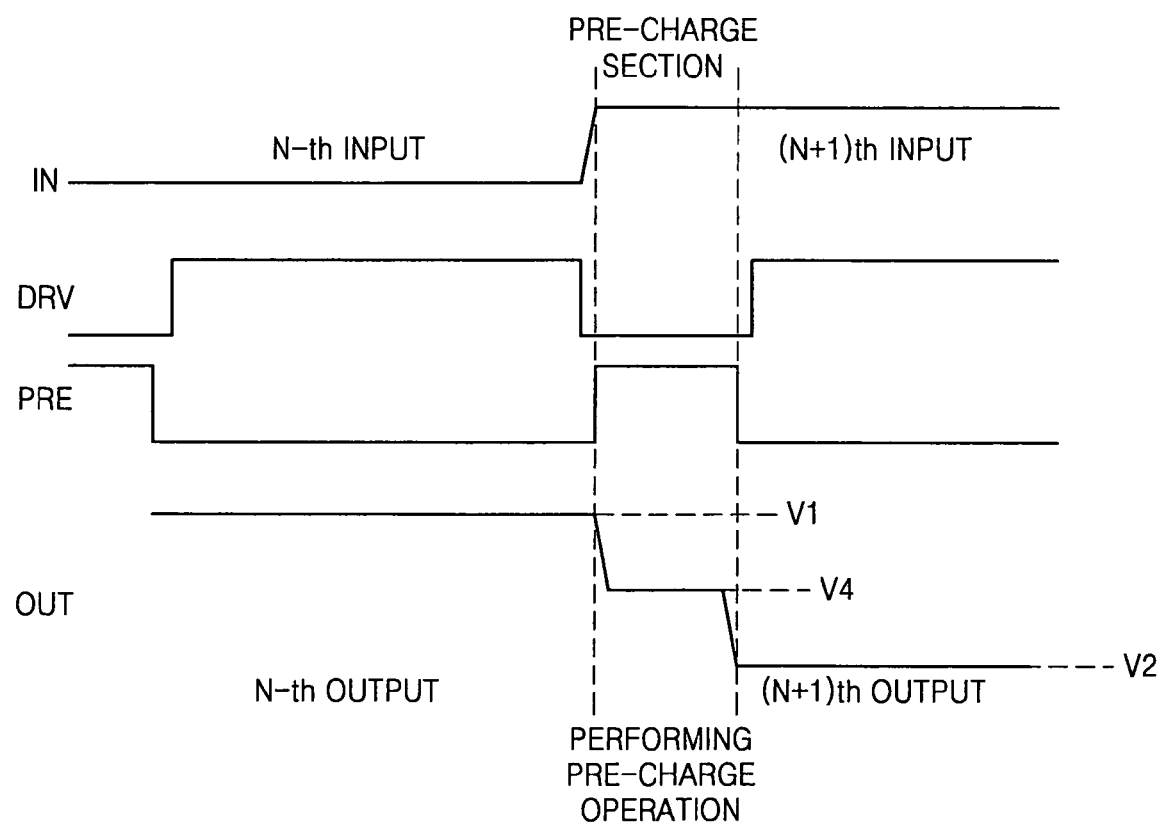
FIGS. 5A and 5B are waveform diagrams for explaining a pre-charge operation of the driving circuit of FIG. 4.
Figure 5B:
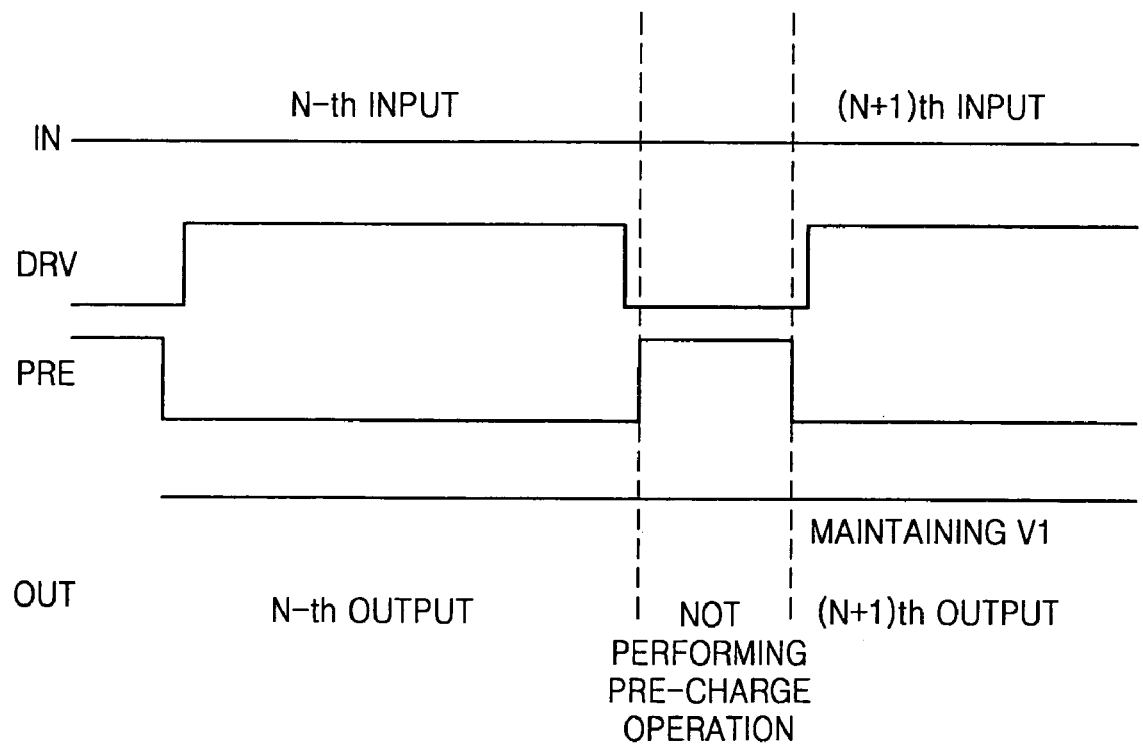

FIGS. 5A and 5B are waveform diagrams for explaining a pre-charge operation of the driving circuit of FIG. 4. In FIG. 5A, in the display operation section, the signal DRV is high while the signal DRVB is low, and the signal PRE is low while the signal PREB is high. When the N-th input IN is low the N-th output is the first voltage V1 that is high. In the pre-charge section, the signal DRV is low while the signal DRVB is high, and the signal PRE is high while the signal PREB is low. Since the newly input (N+1)th input IN is changed to high, the output voltage OUT is changed to the fourth voltage V4 that is the pre-charge voltage. In the display operation section, the (N+1)th output is the second voltage V2 that is low.

In FIG. 5B, since there is no change between the N-th input IN and the (N+1)th input, in the pre-charge section, the output voltage OUT is not changed to the pre-charge level and maintained as it is. Also, the (N+1)th output according to the (N+1)th input IN is continuously maintained without change. Accordingly, since an unnecessary pre-charge operation is not performed, power consumption is reduced.

Figure 6:
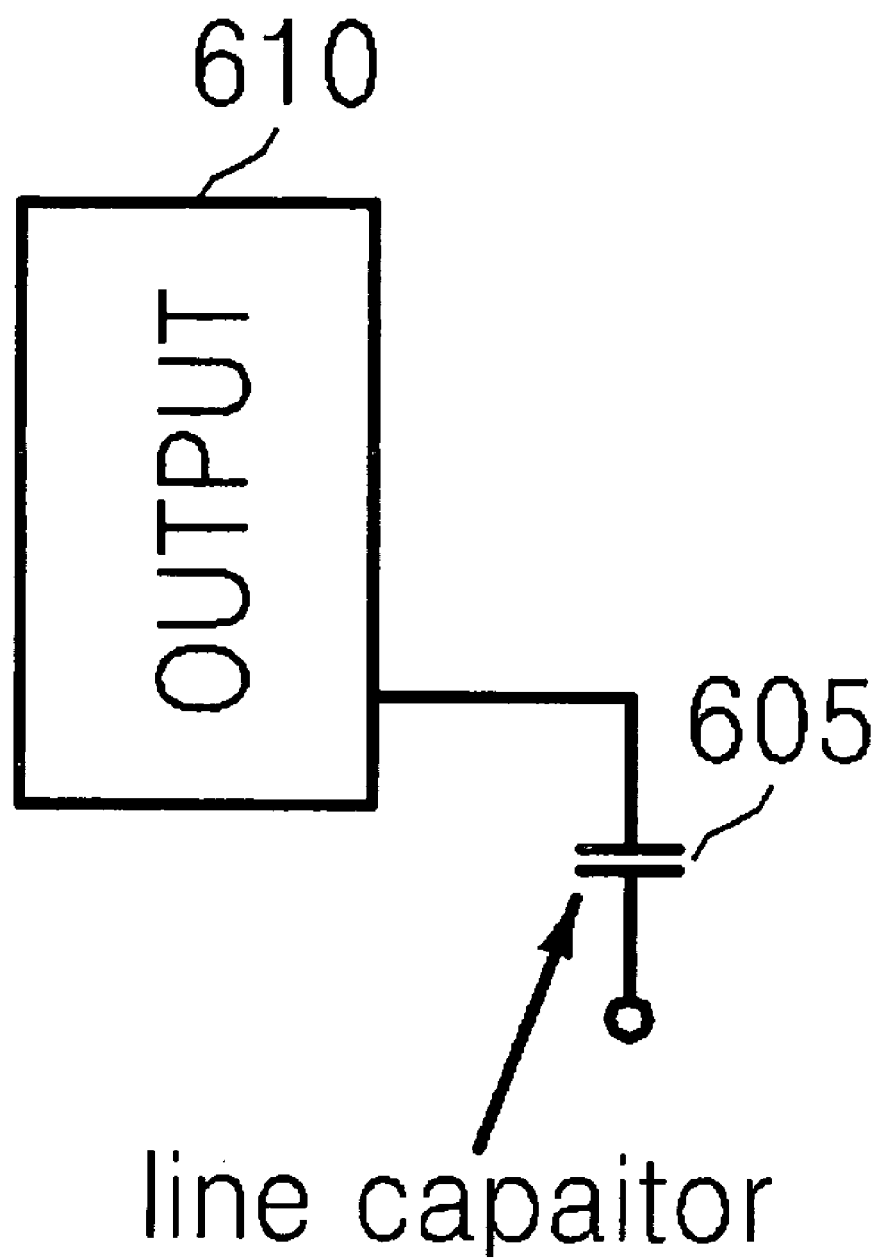
FIG. 6 is a block diagram showing a capacitor connected to the output of FIG. 3 or 4.

FIG. 6 is a block diagram showing a capacitor 605 existing on a panel line connected to the output end 610 of a driving circuit. Output end 610 may be the output end of driving circuit 42 depicted in FIG. 4 Referring to FIG. 6, the capacitor includes all capacitor components like a line capacitor that are parasitically formed by being connected to an output end outputting the output voltage out of the driving circuit.

Figure 7A:
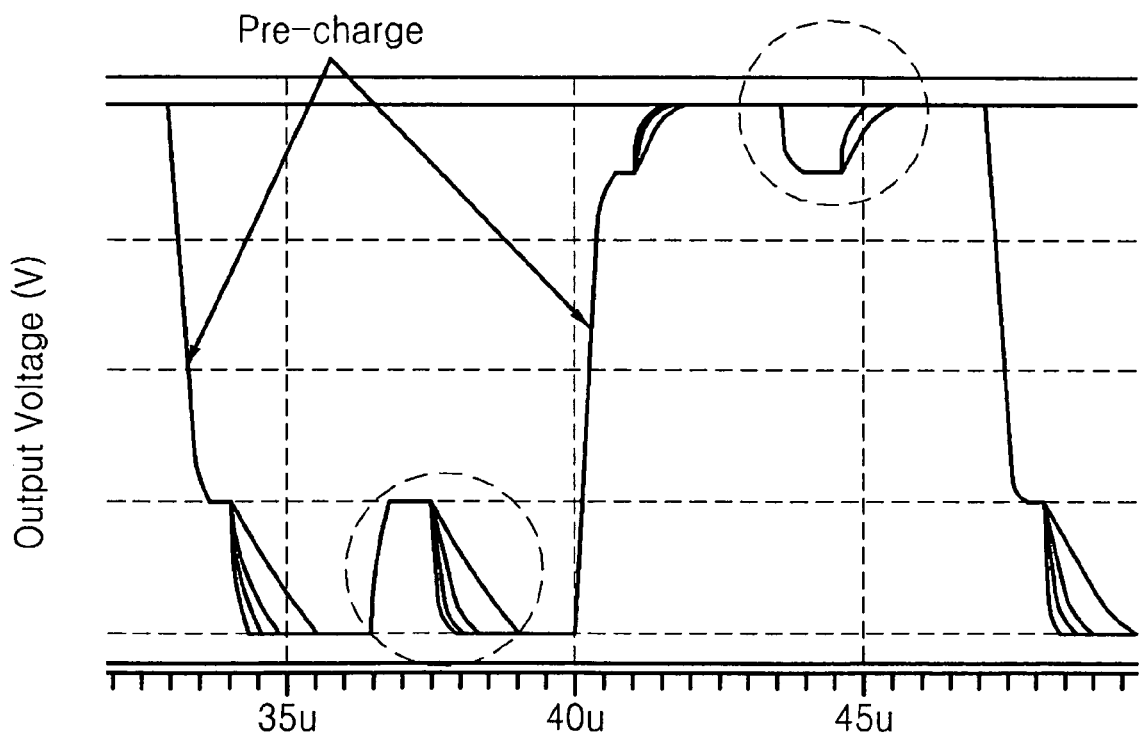
FIGS. 7A and 7B are waveform diagrams, respectively, showing a result of a simulation of an output voltage of the conventional driving circuit of FIG. 2 and a result of a simulation of an output voltage of a driving circuit according to an embodiment of the inventive concept.
Figure 7B:
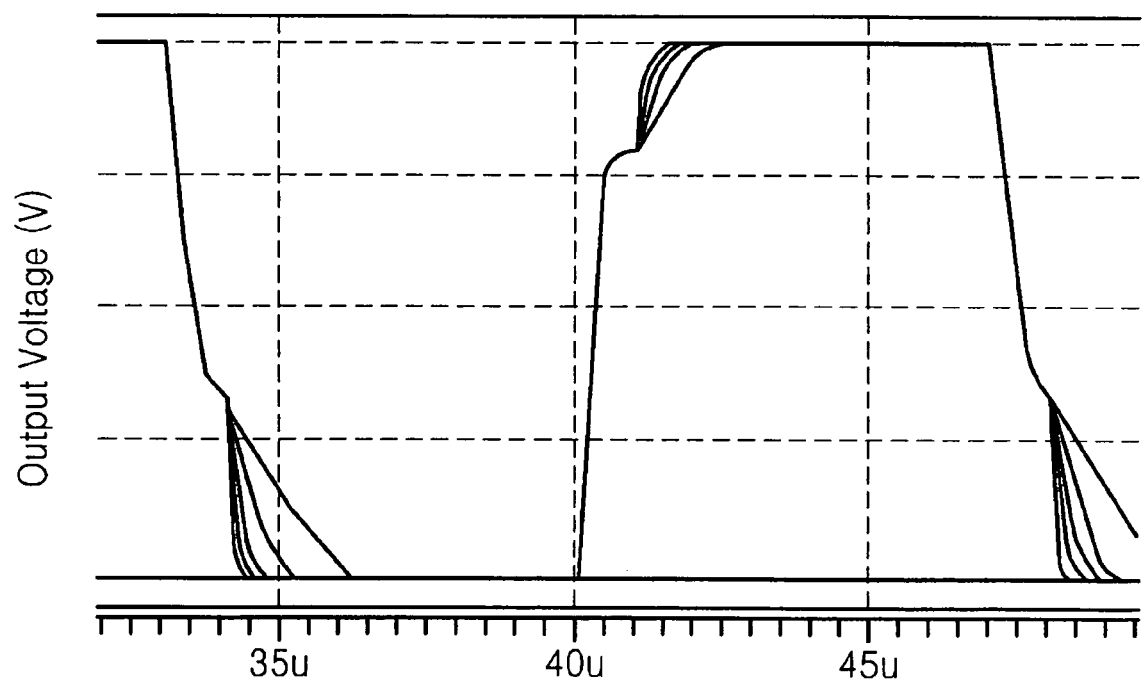

FIGS. 7A and 7B are waveform diagrams, respectively, showing a result of a simulation of an output voltage of the conventional driving circuit of FIG. 2 and a result of a simulation of an output voltage of a driving circuit according to an embodiment of the inventive concept.

FIG. 7A shows a waveform of a simulation of an output voltage according to a result of an unnecessary pre-charge operation performed by a conventional driving circuit of FIG. 2. In FIG. 7A, circled portions show waveforms of current consumed by the unnecessary pre-charge operation.

FIG. 7B shows a waveform of a simulation of an output voltage according to a result of not performing an unnecessary pre-charge operation in a driving circuit according to an embodiment of the inventive concept when there is no change in the input voltage.

As described above, the driving circuit and the method of controlling an output of the driving circuit according to an embodiment of the inventive concept may reduce power consumed by the driving circuit, by not performing an unnecessary pre-charge in a display panel.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A driving circuit comprising:
a driving unit configured to select a first voltage or a second voltage as an N-th output voltage level in response to a first control signal and an N-th input voltage level input from an input unit where N is a natural number; and
a pre-charge unit configured to selectively pre-charge the selected N-th output voltage level to a third voltage or a fourth voltage in response to a second control signal, the selected N-th output voltage level, and a (N+1)th input voltage level that is newly input from the input unit.

2. The driving circuit of claim 1, wherein the pre-charge unit is configured to not operate when the logic values of the selected N-th output voltage level and the newly input (N+1)th input voltage level are the same.

3. The driving circuit of claim 1, wherein the pre-charge unit is configured to not operate when the logic values of the selected N-th output voltage level and the newly input (N+1)th input voltage level are not the same.

4. The driving circuit of claim 2, wherein, when the driving circuit is configured so that when pre-charge unit is not operated, an (N+1)th output voltage level is maintained unchanged.

5. The driving circuit of claim 3, wherein, when the driving circuit is configured so that when pre-charge unit is not operated, an (N+1)th output voltage level is maintained unchanged.

6. The driving circuit of claim 1, wherein the pre-charge unit is configured to operate when the logic values of the selected N-th output voltage level and the newly input (N+1)th input voltage level are the same.

7. The driving circuit of claim 1, wherein the pre-charge unit is configured to operate when the logic values of the selected N-th output voltage level and the newly input (N+1)th input voltage level are not the same.

8. The driving circuit of claim 1, wherein, the pre-charge unit is configured so that when the pre-charge unit is operated, the selected N-th output voltage level is pre-charged to the third voltage or the fourth voltage, and then the selected N-th output voltage level is changed to the (N+1)th output voltage level, wherein the (N+1)th output voltage level is either the first voltage or the second voltage based on the newly input (N+1)th input voltage level.

9. The driving circuit of claim 1, wherein the driving circuit is a display driving circuit.

10. The driving circuit of claim 1, wherein the input unit includes a level shifter that converts an input voltage to the first voltage or the second voltage.

11. The driving circuit of claim 1, wherein the driving unit is a tri-state inverter, the tri-state inverter being configured to select any one of the first voltage, the second voltage, and a floating state in response to the first control signal.

12. The driving circuit of claim 1, wherein the pre-charge unit is configured to not operate when the logic values of the selected N-th output voltage level and the newly input (N+1)th input voltage level are different from each other, in response to the second control signal.

13. The driving circuit of claim 12, wherein the pre-charge unit includes a first transistor of a first conductive type and a second transistor of a second conductive type which are serially connected between the third voltage and the fourth voltage via an output end of the driving unit and, the first transistor and the second transistor being configured to turn on in response to the second control signal, and
the pre-charge unit is configured so that when the logic values of the selected N-th output voltage level and the newly input (N+1)th input voltage level are different from each other, the pre-charge unit is disconnected from the third voltage or the fourth voltage and does not perform a pre-charge operation.

14. The driving circuit of claim 1, wherein the pre-charge unit is configured to operate when the logic values of the selected N-th output voltage level and the newly input (N+1)th input voltage level are the same, in response to the second control signal.

15. The driving circuit of claim 14, wherein the pre-charge unit includes a first transistor of a first conductive type and a second transistor of a second conductive type which are serially connected between the third voltage and the fourth voltage via an output end of the driving unit and,
the pre-charge unit is configured so that when the first transistor and the second transistor are turned on in response to the second control signal and the logic values of the selected N-th output voltage level and the newly input (N+1)th input voltage level are the same, the pre-charge unit is connected to the third voltage or the fourth voltage and performs a pre-charge operation.

16. The driving circuit of claim 13, wherein one of the driving unit or the pre-charge unit includes a third transistor of the first conductive type and a fourth transistor of the second conductive type, the driving circuit being configured so that when a pre-charge section related to the second control signal ends, the first transistor and the second transistor are turned off and the third transistor and the fourth transistor are turned on in response to the first control signal so that an (N+1)th output voltage level is changed to either the first voltage or the second voltage based on the newly input (N+1)th input voltage level.

17. The driving circuit of claim 1, wherein the driving circuit is configured so that third voltage and the fourth voltage are the same.

18. The driving circuit of claim 1, wherein the driving circuit is configured so that third voltage is smaller than the first voltage and greater than (the first voltage+the second voltage)/2, and the fourth voltage is smaller than (the first voltage+the second voltage)/2 and greater than the second voltage.

* * * * *